United States Patent
Reiderman et al.

(10) Patent No.: US 10,897,824 B2
(45) Date of Patent: Jan. 19, 2021

(54) ENCAPSULATION OF DOWNHOLE MICROELECTRONICS AND METHOD THE SAME

(71) Applicants: Aleksey Reiderman, Houston, TX (US); Zhenzhen Shen, The Woodlands, TX (US)

(72) Inventors: Aleksey Reiderman, Houston, TX (US); Zhenzhen Shen, The Woodlands, TX (US)

(73) Assignee: BAKER HUGHES, A GE COMPANY, LLC, Houston, TX (US)

( * ) Notice: Subject to any disclaimer, the term of this patent is extended or adjusted under 35 U.S.C. 154(b) by 107 days.

(21) Appl. No.: 15/796,928

(22) Filed: Oct. 30, 2017

(65) Prior Publication Data
US 2019/0132959 A1    May 2, 2019

(51) Int. Cl.
| | | |
|---|---|---|
| H05K 3/20 | (2006.01) |
| H05K 3/28 | (2006.01) |
| H05K 7/20 | (2006.01) |
| H05K 1/18 | (2006.01) |
| H05K 5/00 | (2006.01) |
| H05K 1/03 | (2006.01) |

(Continued)

(52) U.S. Cl.
CPC .......... *H05K 3/284* (2013.01); *E21B 47/017* (2020.05); *H05K 1/0373* (2013.01); *H05K 1/181* (2013.01); *H05K 5/0004* (2013.01); *H05K 5/064* (2013.01); *H05K 7/2039* (2013.01); *H01L 2224/48091* (2013.01); *H05K 2201/0209* (2013.01); *H05K 2201/10287* (2013.01); *H05K 2201/10522* (2013.01); *H05K 2203/087* (2013.01); *H05K 2203/122* (2013.01); *H05K 2203/1338* (2013.01)

(58) Field of Classification Search
CPC ... H05K 1/00; H05K 1/11; H05K 1/14; H05K 1/18; H05K 5/0082; H05K 3/02; H05K 3/20; H05K 3/284–287
USPC ........ 361/735–737, 749, 760–782, 700–710; 174/350–355
See application file for complete search history.

(56) References Cited

U.S. PATENT DOCUMENTS

| | | | | |
|---|---|---|---|---|
| 7,435,625 B2 * | 10/2008 | Condie | ................. | H01L 23/295 174/522 |
| 8,498,125 B2 * | 7/2013 | Hall | ...................... | E21B 47/011 361/735 |

(Continued)

FOREIGN PATENT DOCUMENTS

KR     200387531 Y1     6/2005

OTHER PUBLICATIONS

Notification of Transmittal of the International Search Report and the Written Opinion of the International Searching Authority, or the Declaration; PCT/US2018/057523; dated Mar. 11, 2019; 13 pages.

*Primary Examiner* — Tuan T Dinh
(74) *Attorney, Agent, or Firm* — Cantor Colburn LLP

(57) ABSTRACT

A method of encapsulating an electronic assembly comprises disposing a plurality of electrically non-conductive particles on a substrate which carries one or more components of the electronic assembly; introducing a reactive parylene monomer in a vapor form into interstitial spaces among the plurality of the electrically non-conductive particles; and forming a parylene binder in the interstitial spaces of the electrically non-conductive particles from the reactive parylene monomer.

23 Claims, 4 Drawing Sheets

(51) Int. Cl.
  *H05K 5/06* (2006.01)
  *E21B 47/017* (2012.01)

(56) References Cited

U.S. PATENT DOCUMENTS

| | | | |
|---|---|---|---|
| 8,691,935 B2 | 4/2014 | Harkabus et al. | |
| 2008/0216704 A1 | 9/2008 | Eisenbeis et al. | |
| 2009/0263581 A1 | 10/2009 | Martin et al. | |
| 2010/0140673 A1* | 6/2010 | Daniel | H05K 1/0221 |
| | | | 257/288 |
| 2011/0132449 A1* | 6/2011 | Ramadas | B82Y 30/00 |
| | | | 136/256 |
| 2011/0304991 A1 | 12/2011 | Huang et al. | |
| 2012/0152545 A1 | 6/2012 | Takeda et al. | |
| 2013/0011617 A1* | 1/2013 | Tasaki | C09C 3/12 |
| | | | 428/148 |
| 2014/0347819 A1* | 11/2014 | Ott | H05K 5/0082 |
| | | | 361/714 |
| 2015/0314941 A1* | 11/2015 | Ramadas | B32B 5/16 |
| | | | 361/679.01 |
| 2016/0027971 A1* | 1/2016 | Anc | C09K 11/025 |
| | | | 257/98 |
| 2017/0271562 A1* | 9/2017 | Wang | H01L 33/60 |

* cited by examiner

ENCAPSULATION OF DOWNHOLE MICROELECTRONICS AND METHOD THE SAME

BACKGROUND

Downhole electronics are often needed to be secured against corrosive chemicals, foreign objects, and high pressure and high temperature environments in order to maintain proper functioning and reliability. Thus these electronics are often encapsulated. Common encapsulation methods include epoxy encapsulation, transfer molding, glob top, or dam and fill. For multi-chip module electronic components, chips and wire bonds can be placed inside a housing having a lid welded or otherwise attached to the housing using an adhesive. As encapsulation is essential for downhole electronics, alternative encapsulation methods are continuously sought.

BRIEF DESCRIPTION

A method of encapsulating an electronic assembly comprises disposing a plurality of electrically non-conductive particles on a substrate which carries one or more components of the electronic assembly; introducing a reactive parylene monomer in a vapor form into interstitial spaces among the plurality of the electrically non-conductive particles; and forming a parylene binder in the interstitial spaces of the electrically non-conductive particles from the reactive parylene monomer.

An encapsulated electronic assembly comprises: a substrate; one or more components disposed on the substrate; a sealing structure comprising a plurality of electrically non-conductive particles; and a parylene binder locking the plurality of electrically non-conductive particles to each other, to the substrate, and to the one or more components disposed on the substrate.

A downhole tool comprising the encapsulated electronic assembly is also disclosed.

BRIEF DESCRIPTION OF THE DRAWINGS

The following descriptions should not be considered limiting in any way. With reference to the accompanying drawings, like elements are numbered alike.

DETAILED DESCRIPTION

Figure 1:
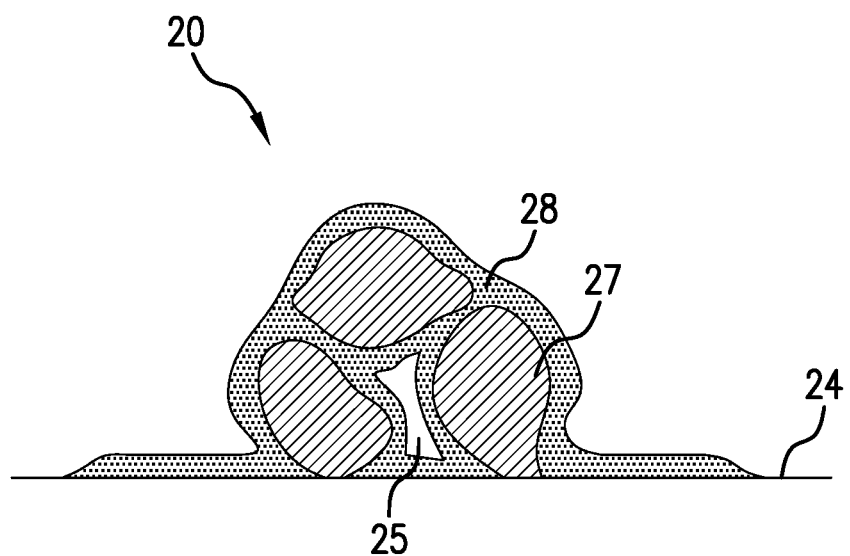
FIG. 1 shows a cross-sectional view of a portion of an exemplary sealing structure according to an embodiment of the disclosure.

An encapsulation method is disclosed, which uses electrically non-conductive particles and a parylene binder to encapsulate an electronic assembly. In particular, the electrically non-conductive particles are disposed on a substrate which carries the components to be protected. A reactive parylene monomer in a vapor form then substantially penetrates through the electrically non-conductive particles forming a parylene binder locking these particles to each other as well as to the substrate and components on the substrate.

The encapsulation method as well as the encapsulated assemblies disclosed herein offer a number of benefits over those commonly known in the art. The encapsulation method as disclosed herein does not release halogen as opposed to most epoxy-based encapsulation. In addition, the sealing structure formed from the electrically non-conductive particles and the parylene binder are flexible and have low modulus. Thus when a mechanical force is applied to the sealing structure, the force does not pass on to the components to be protected. Moreover, the sealing structure has excellent thermal stability and can be stable up to 350° C., which is higher than most of the epoxy encapsulants. Further the sealing structure formed from electrically non-conductive particles and parylene binder offers superior thermal conductivity and excellent electrical isolation when compared to gas-filled hermetic packaging. As an additional advantageous feature, a lid that is normally used in multi-chip module package is not required in the method disclosed herein. The encapsulation also provides thermal coupling interface for heatsinks and/or chassis.

As used herein, electrically non-conductive particles refer to particles having an electrical resistivity of greater than $10^{12}$ Ω*cm determined at 23° C. in accordance with ASTM D 1829. The electrically non-conductive particles can have excellent thermal conductivity, for example, a thermal conductivity of 15 W/m-K or greater at 23° C. determined according to ASTM C408. Exemplary materials of the electrically non-conductive particles include hexagonal boron nitride, silicon nitride, or a combination comprising at least one of the foregoing.

The electrically non-conductive particles can have an average diameter of about 0.5 microns to about 15 microns. As used herein, "average diameter" means average largest dimension based on number average particle size and can be determined by high resolution electron or atomic force microscope technology. The selection of the size of the particles may depend on the size of the smallest feature of the electronic assembly. For example, a 20 μm bondwire requires smaller particles than a 250 μm bonwire. The shape of the electronically non-conductive particles is not particularly limited. In an embodiment, the electrically non-conductive particles have irregular shapes. The irregular shaped particles allow the reactive parylene monomer vapor to penetrate deeper into the powder bed. Highly ordered rectangular or spherical particles would have smaller number and size crevices for the reactive parylene monomer vapor to penetrate. Alternatively, the electrically non-conductive particles can be a combination of particles having two or more regular shapes, for example, a combination of particles having spherical shapes and particles having rectangular shapes. The particles can also be a combination of particles having different average diameters, regardless whether these particles have a regular or irregular shape. For example, the electrically non-conductively particles can be a combination of a first powder comprising first particles having a first average diameter and a second powder comprising second particles having a second average diameter, wherein the ratio of the first average diameter relative to the second average diameter is about 10:1 to about 1.5:1 to facilitate the penetration of the reactive parylene monomer vapor.

The electrically non-conductive particles can be disposed on a substrate carrying various components to be protected. The method of disposing is not particularly limited. Any known methods of dispensing particles on a substrate can be used. Optionally, before the electrically non-conductive particles are disposed on the substrate, the substrate is treated with a primer. Exemplary primers include silanes such as gamma-methacryloxypropyltrimethoxy silane, commercially available as SILQUEST A-174 from Momentive Performance Materials Inc. The primer can be applied to the substrate as a liquid or vapor depending on the composition of the primer used.

The electrically non-conductive particles can form a layer on the substrate. Exemplary thickness of the non-conductive particle layer is about 0.1 millimeter to about 2 millimeters, preferably about 0.5 millimeter to about 1 millimeter.

The parylene binder can be a fluorinated poly-para-xylylene. In an embodiment, the fluorinated poly-para-xylylene comprises repeating units of formula (1):

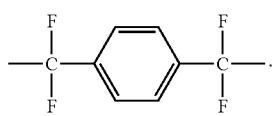

A parylene binder having repeating units of formula (2) can also be used:

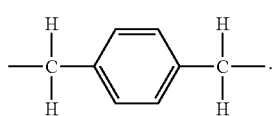

The parylene binder can have greater than 10, greater than 20, greater than 50, or greater than 100 repeating units of formula (1), (2), or a combination thereof.

The optionally fluorinated poly-para-xylylene can be deposited in the interstitial spaces among the electrically non-conductive particles by a pyrolytic deposition process. Such process begins with the vaporization of a precursor. Exemplary precursors include, but are not limited to, octafluoro[2.2]paracyclophane, $BrCF_2$—$C_6H_4$—$CF_2Br$, and [2,2]paracyclophane. The temperature to vaporize the precursor can be greater than about 50° C. but less than 250° C.

The vaporized precursor can be pyrolytically cleaved to form a reactive parylene monomer vapor. The pyrolysis is normally conducted at a temperature of about 600° C. to about 700° C., specifically 650° C. to about 700° C. The reactive monomer vapor is a diradical, diflural para-xylylene, which can have a formula of $.CF_2$—$C_6H_4$—$CF_2.$, $.CH_2$—$C_6H_4$—$CH_2.$, or a combination thereof.

The reactive monomer vapor is then transferred to a deposition chamber, where it condenses on the surface of the electrically non-conductive particles to form a fluorinated poly-para-xylylene binder in the interstitial spaces among the electrically non-conductive particles. The deposition can be conducted at room temperature, for example about 18° C. to about 30° C. The pressure of the deposition chamber can be around or lower than 0.8 Torr, lower than 0.1 Torr, or lower than 0.05 Torr, for example about 5 Pa (0.0375 Torr).

The volume ratio of the electrically non-conductive power particles relative to the parylene binder is about 70:30 to about 99.99:0.01, or about 80:20 to about 99:1, or about 90:10 to about 99:1. The ratio can be adjusted by tuning the deposition time and the particle size of the electrically non-conductive particles. In an embodiment, the deeper into the powder bed of electrically non-conductive particles, the less parylene binder is in the sealing structure. Thus the volume ratio of the electrically non-conductive particles relative to the parylene binder can be in a gradient and generally increase from an inner portion proximate the substrate toward an outer portion away from the substrate. Slight taping during deposition however, can increase number of fully coated particle and increase amount of parylene binder within the encapsulation.

The electrically non-conductive particles and the parylene binder form a sealing structure. The sealing structure can have a thickness of about 0.1 millimeter to about 2 millimeters or about 0.5 millimeter to about 1 millimeter. The process can be repeated to adjust the thickness of the sealing structure. Thus in an embodiment, the method further includes disposing second electrically non-conductive power particles on the sealing structure formed from the electrically non-conductive powder and the parylene binder; introducing a second reactive parylene monomer in a vapor form into second interstitial spaces among the second particles; and forming a second parylene binder in the second interstitial spaces of the second particles from the second reactive parylene monomer.

In certain embodiments, the sealing structure has a network of the electrically non-conductive particles which can be a continuous network where a number of adjacent electrically non-conductive particles are in touching contact or joined to one another throughout the sealing structure. In the instance where the electrically non-conductive particles are joined by a parylene binder, the average thickness of the parylene binder between electrically non-conductive particles is 0 to about 25 μm. Within this range, it is possible that the average thickness of the parylene binder between the electrically non-conductive particles is 0 to about 12 μm or 0 to about 5 μm.

Binding is typically caused by continuous film of parylene over adjacent particles. Thickness of Parylene between particles can range from 0 to full thickness of deposition, for example, 25 μm. The sealing structure can include fully encapsulated electrically non-conductively particles, partially encapsulated electrically non-conductive particles, or a combination thereof.

In certain other embodiments, the network may be a partially continuous network where a number of adjacent electrically non-conductive particles are joined to one another beyond immediately adjacent particles, such that the continuity extends beyond immediately adjacent electrically non-conductive particles to establish a partially continuous network. Depending on the extent of the continuity, the partially continuous network may also be described as locally continuous. For example, if the partial continuity of the network extends only to a small cluster of immediately electrically non-conductive particles, the network may be said to be locally continuous, such as for example, if the network extends about 2 to less than about 50 particle diameters, and more particularly about 2 to about 30 particle diameters or about 2 to about 20 particle diameters. Without wishing to be bound by theory, it is believed that a sealing structure having a continuous or partially continuous network of the electrically non-conductive particles can have better heat transfer properties as compared to a sealing structure having a discontinuous network of the same electrically non-conductive particles.

It is appreciated that not all the spaces among the electrically non-conductive particles are filled by the parylene binder. In an embodiment, the volume of the unfilled spaces among the electrically non-conductively particles is about 0.1% to about 20%, about 0.5% to about 10%, or about 0.1% to about 5%, each based on the total volume of the sealing structure.

Figure 2:
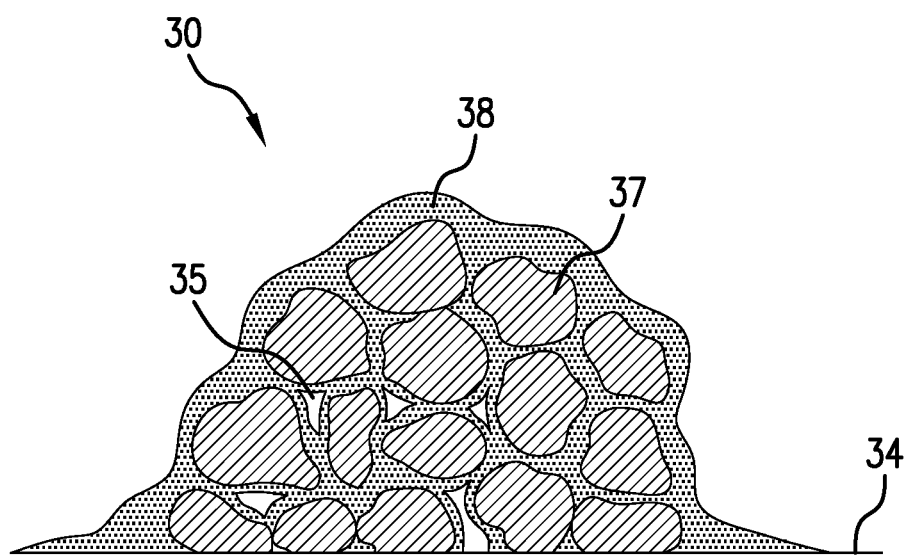
FIG. 2 shows a cross-sectional view of a portion of an exemplary sealing structure according to another embodiment of the disclosure.
Figure 3:
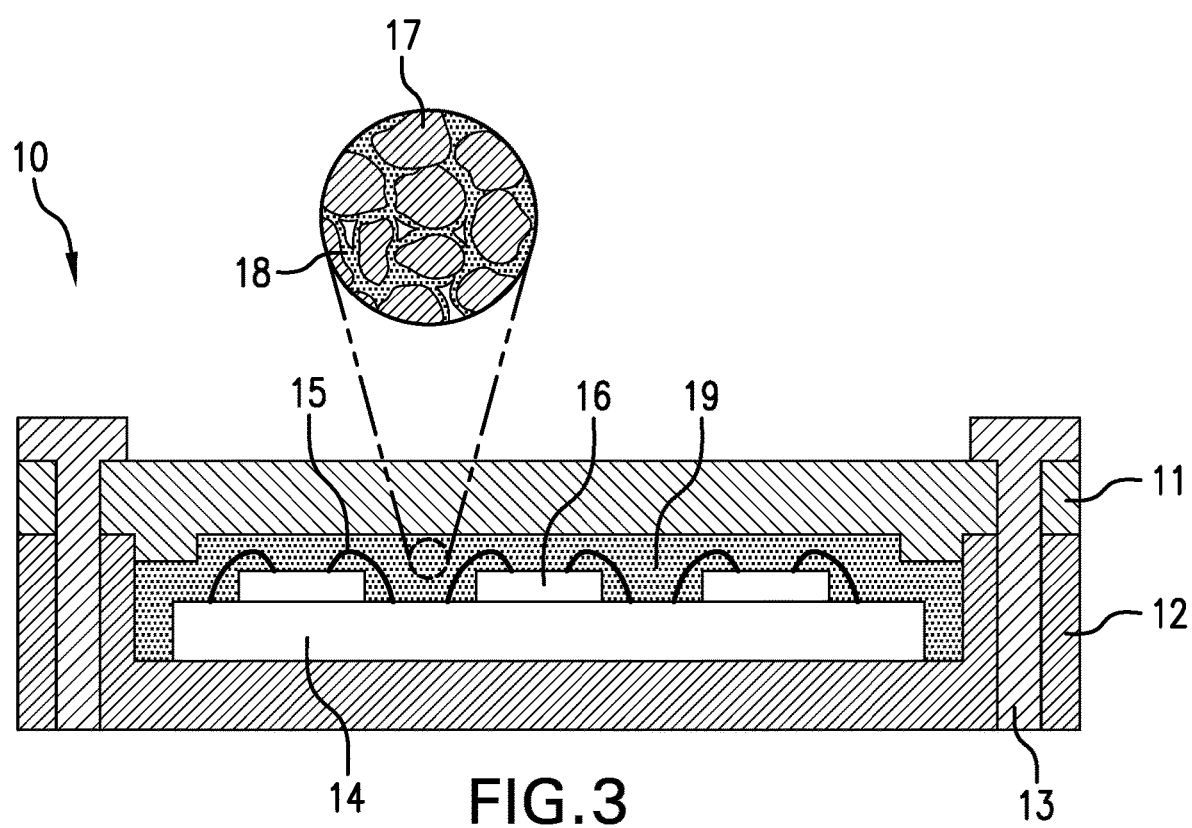
FIG. 3 shows a cross-sectional view of an encapsulated electronic assembly according to an embodiment of the disclosure.

FIGS. 1 and 2 show a cross-sectional view of a portion of exemplary sealing structures. As shown in these figures, the sealing structure (20, 30) includes electrically non-conductive particles (27, 37) and a parylene hinder (28, 38). The parylene binder (28, 38) forms a film on the surface of the electronically non-conductive particles (27, 37) as well as a surface of the substrate (24, 34). There are unfilled voids (25, 35) in the sealing structure (20, 30).

An encapsulated electronic assembly is illustrated in the figure of the disclosure. As shown in the figure, an encapsulated electronic assembly (10) includes a substrate (14), one or more components (15, 16) disposed on the substrate (14), and a sealing structure (19) comprising a plurality of electrically non-conductive particles (17) and a parylene binder (18) locking the plurality of electrically non-conductive particles (17) to each other, to the substrate (14), and to the electrical or electronic components (15, 16) disposed on the substrate (14).

The sealing structure can include about 70 to about 99.9 vol % of the electrically non-conductive particles and about 30 to about 0.1 vol % of the parylene binder, each based on the total volume of the sealing structure. The sealing structure can also include about 80 to about 99 vol % of the electrically non-conductive particles and about 20 to about 1 vol % of the parylene binder, each based on the total volume of the sealing structure. In an embodiment, the sealing structure includes about 90 to about 99 vol % of the electrically non-conductive particles, and about 10 to about 1 vol % of the parylene binder, each based on the total volume of the sealing structure. The sealing structure can be free of solid particles other than the electrically non-conductive particles. In an embodiment, the sealing structure is free of solid particles other than hexagonal boron nitride, silicon nitride, or a combination thereof.

The substrate is not particularly limited. For electronic assemblies used for downhole applications, the substrate can be a rigid substrate such as a ceramic substrate or a flexible substrate such as a polyimide substrate. Exemplary components disclosed on the substrate (14) include chips (16) and wire bonds (15). Other components (not shown) such as surface mount devices (SMD), sensing devices, conductive and isolation structured created by additive manufacturing (e.g. microdispensing) can also be included.

The encapsulated electronic assembly (10) can also include a package base (12) such as a housing. The housing can be high-temperature polymer based such as polyetheretherketone (PEEK) or ceramic or a metal based housing comprising a ceramic, a metal or a metal alloy as a major component. The substrate (14) is disposed on the package base (12). The package base can be flat or have a curved structure. The package base (12) together with the sealing structure (19) provide excellent protection to the substrate as well as the components disposed on the substrate.

Areas of encapsulation without wire bonds and other brittle components can be used as compressible thermal interfaces for heatsinks, chassis, and the like. In the exemplary embodiment shown in the figure, the electronic assembly (10) further includes a heat sink (11) which is disposed on a surface of the sealing structure (19) opposing the substrate (24). A fastening means (13) can be used to couple the heat sink (11) to the package base (12). In addition to heatsinks, compliance of this encapsulation structure also allows mounting to non-flat, rough, and curved surfaces.

Various electronic assemblies such as multi-chip modules can be encapsulated using the method disclosed herein. The encapsulated electronic assemblies can be incorporated into electronic devices. Also disclosed are downhole tools comprising the encapsulated electronic assemblies. Such downhole tools include those used in drilling and monitoring equipment, such as recording memory/controllers/processors used in wireline, logging-while-drilling (LWD) or measurement-while-drilling (MWD) tools. The encapsulated electronic assemblies can also be used in various other types of tools with a variety of conveyance mechanisms, such as coiled tubing, wired drill pipe, slickline, and the like.

Figure 4:
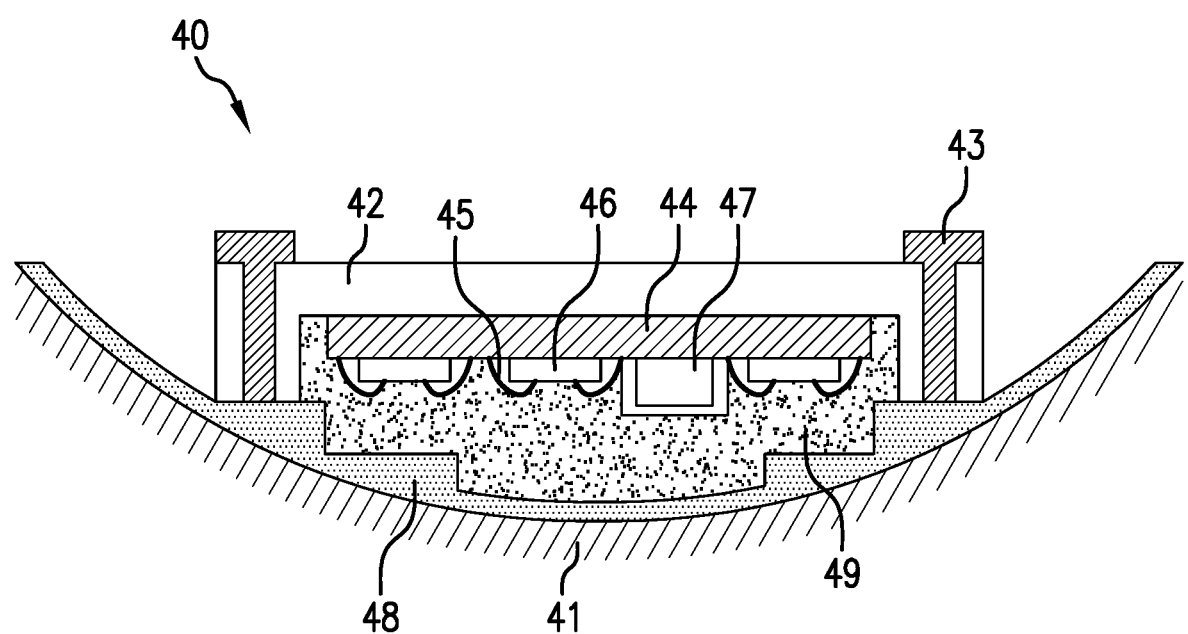
FIG. 4 shows a cross-sectional view of a portion of a downhole tool having an encapsulated electronic assembly incorporated therein according to an embodiment of the disclosure.
Figure 5:
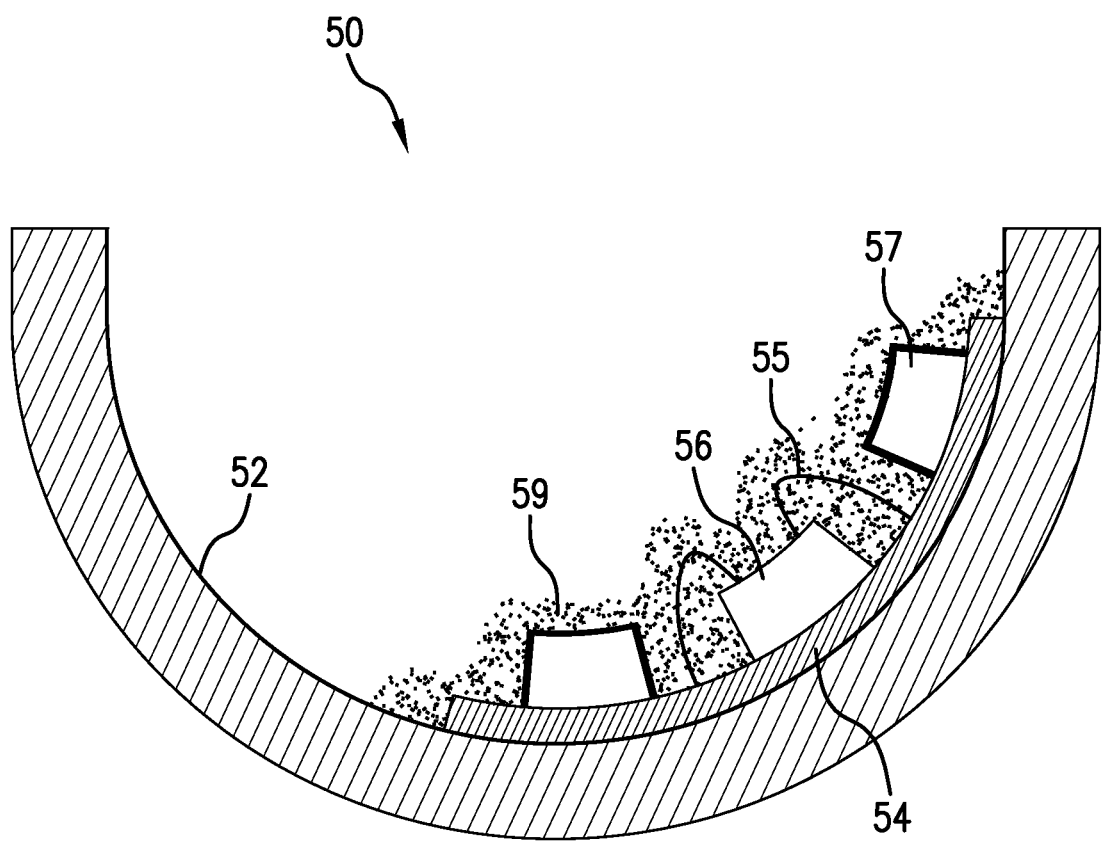
FIG. 5 shows a cross-sectional view of a portion of a downhole tool having an encapsulated electronic assembly incorporated therein according to another embodiment of the disclosure.

Methods of incorporating the encapsulated electronic assembly are not limited. FIGS. 4 and 5 show cross-sectional views of a portion of downhole tools having an encapsulated electronic assembly incorporated therein. In FIG. 4, the encapsulated electronic assembly, which includes a package base (42), a substrate (44), electronic components (45, 46, 47), and a sealing structure (49) is amount to a surface (41) of a downhole tool (40) via a mechanical means (43). Exemplary surfaces include internal walls of a downhole tool. Because the sealing structure is flexible, the encapsulated electronic assembly can be mounted to curved surfaces. The surfaces can be a rough surface and/or include extrusions (48).

A segment of a downhole tool or a cavity in a downhole tool can serve as the package base for the encapsulated electronic assemblies. In FIG. 5, an encapsulated electronic assembly, which includes a substrate 54, electronic components (55, 56, 57) disposed on the substrate, and an encapsulation structure (59) as described herein, disposed on a cavity (52) of a downhole (50). As shown in FIG. 5, the encapsulant including electrically non-conductive particles and parylene binder locks the encapsulated electronic assembly to the tool. Separate mechanical means can also be used to couple the encapsulated electronic assembly to the tool.

Set forth are various embodiments of the disclosure.

Embodiment 1

A method of encapsulating an electronic assembly, the method comprising: disposing a plurality of electrically non-conductive particles on a substrate which carries one or more components of the electronic assembly; introducing a reactive parylene monomer in a vapor form into interstitial spaces among the plurality of the electrically non-conductive particles; and forming a parylene binder in the interstitial spaces of the electrically non-conductive particles from the reactive parylene monomer.

Embodiment 2

The method of any of the proceeding embodiments, wherein the electrically non-conductive particles have an electrical resistivity of greater than $10^{12}$ $\Omega$*cm determined at 23° C. in accordance with ASTM D 1829.

Embodiment 3

The method of any of the proceeding embodiments, wherein the electrically non-conductive particles comprises hexagonal boron nitride, silicon nitride, or a combination comprising at least one of the foregoing.

Embodiment 4

The method of any of the proceeding embodiments, wherein the electronically non-conductive particles have an irregular shape. Alternatively, the electronically non-conductive particles comprise a first powder having first particles with a first regular shape and a first average diameter and a second powder having second particles with a second regular shape and a second average diameter, wherein the first regular shape is different from the second regular shape, the first average diameter is different from the second average diameter, or a combination thereof.

Embodiment 5

The method of any of the proceeding embodiments, wherein the electronically non-conductive particles have an average diameter of about 0.5 microns to about 15 microns Embodiment 6

The method of any of the proceeding embodiments, wherein the electrically non-conductive particles form a continuous network.

Embodiment 7

The method of any of the proceeding embodiments, wherein the parylene binder comprises a poly-para-xylylene having repeating units of the formula

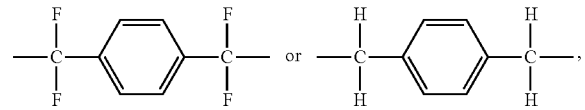

or a combination thereof.

Embodiment 8

The method of any of the proceeding embodiments, wherein the volume ratio of the electrically non-conductive particles relative to the parylene binder is about 70:30 to about 99.99:0.01.

Embodiment 9

The method of any of the proceeding embodiments, wherein the electrically non-conductive particles and the parylene binder form a sealing structure having a thickness of about 0.1 millimeter to about 2 millimeters.

Embodiment 10

The method of any of the proceeding embodiments, further comprising: disposing second electrically non-conductive particles on a sealing structure formed from the electrically non-conductive particles and the parylene binder; introducing a second reactive parylene monomer in a vapor form into second interstitial spaces among the second electrically non-conductive particles; and forming a second parylene binder in the second interstitial spaces of the second particles from the second reactive parylene monomer.

Embodiment 11

The method of any of the proceeding embodiments, further comprising disposing a heat sink on a sealing structure formed from the electrically non-conductive particles and the parylene binder.

Embodiment 12

The method of any of the proceeding embodiments, wherein the electronic component is a multi-chip module.

Embodiment 13

An encapsulated electronic assembly comprising: a rigid or a flexible substrate; one or more components disposed on the substrate; a sealing structure comprising a plurality of electrically non-conductive particles and a parylene binder locking the plurality of electrically non-conductive particles to each other, to the substrate, and to the one or more components disposed on the substrate.

Embodiment 14

The encapsulated electronic assembly of any of the proceeding embodiments, wherein the electrically non-conductive particles form a continuous network.

Embodiment 15

The encapsulated electronic assembly of any of the proceeding embodiments, wherein the electrically non-conductive particles comprise hexagonal boron nitride, silicon nitride, or a combination comprising at least one of the foregoing; the parylene binder comprises a poly-para-xylylene; and the volume ratio of the electrically non-conductive particles relative to the parylene binder is about 70:30 to about 99.99:0.01

Embodiment 16

The encapsulated electronic assembly of any of the proceeding embodiments, wherein the one or more components comprise wire bonds, chips, surface mount devices (SMD), sensing devices, conductive and isolation structured created by additive manufacturing, or a combination comprising at least one of the foregoing.

Embodiment 17

The encapsulated electronic assembly of any of the proceeding embodiments, further comprising a heat sink disposed on the sealing structure opposing the substrate.

Embodiment 18

The encapsulated electronic assembly of any of the proceeding embodiments, further comprising a package base, and the substrate is disposed on the package base.

Embodiment 19

The encapsulated electronic assembly of any of the proceeding embodiments, wherein the heat sink is coupled to the package base.

Embodiment 20

The encapsulated electronic assembly of any of the proceeding embodiments, wherein the encapsulated electronic assembly is a multi-chip module.

Embodiment 21

A downhole tool comprising the encapsulated electronic assembly of of any of the proceeding embodiments.

Embodiment 22

The downhole tool of any of the proceeding embodiments, wherein the sealing structure is coupled to a curved surface opposing the substrate. The curved surface can have extrusions. The cured surface can be an inner wall of the downhole tool.

Embodiment 23

The downhole tool of any of the proceeding embodiments, wherein the substrate of the encapsulated electronic assembly is disposed on a segment of the downhole tool or a cavity in the downhole tool. The sealing structure that comprises the electrically non-conductive particles and the parylene binder can be extended to the segment of the downhole tool or the cavity in the downhole tool locking the encapsulated electronic assembly to the segment or cavity of the downhole tool.

All ranges disclosed herein are inclusive of the endpoints, and the endpoints are independently combinable with each other. As used herein, "combination" is inclusive of blends, mixtures, alloys, reaction products, and the like. All references are incorporated herein by reference.

The use of the terms "a" and "an" and "the" and similar referents in the context of describing the invention (especially in the context of the following claims) are to be construed to cover both the singular and the plural, unless otherwise indicated herein or clearly contradicted by context. "Or" means "and/or." The modifier "about" used in connection with a quantity is inclusive of the stated value and has the meaning dictated by the context (e.g., it includes the degree of error associated with measurement of the particular quantity).

What is claimed is:

1. A method of forming the encapsulated electronic assembly, the method comprising:
    disposing a plurality of electrically non-conductive particles on a substrate which carries one or more components of the electronic assembly;
    introducing a reactive parylene monomer in a vapor form into interstitial spaces among the plurality of the electrically non-conductive particles;
    forming a sealing structure comprising the plurality of electrically non-conductive particles and the parylene binder in the interstitial spaces of the electrically non-conductive particles derived from the reactive parylene monomer, the electrically non-conductive particles comprising hexagonal boron nitride, silicon nitride, or a combination comprising at least one of the foregoing, and the parylene binder locking the plurality of electrically non-conductive particles to each other, to the substrate, and to the one or more components disposed on the substrate;
    disposing a heat sink on the sealing structure opposing the substrate;
    disposing the substrate on a package base; and
    coupling the heat sink to the package base.

2. The method of claim 1, wherein the electronically non-conductive particles have an irregular shape.

3. The method of claim 1, wherein the electronically non-conductive particles comprise a first powder having first particles with a first regular shape and a first average diameter and a second powder having second particles with a second regular shape and a second average diameter, wherein the first regular shape is different from the second regular shape, the first average diameter is different from the second average diameter, or a combination thereof.

4. The method of claim 1, wherein the electrically non-conductive particles form a continuous network.

5. The method of claim 1, wherein the parylene binder comprises a poly-para-xylylene having repeating units of the formula

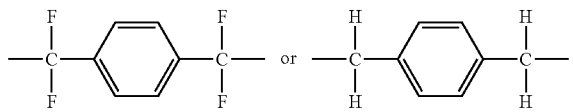

or a combination thereof.

6. The method of claim 1, wherein the volume ratio of the electrically non-conductive particles relative to the parylene binder is about 70:30 to about 99.99:0.01.

7. The method of claim 1, wherein the electrically non-conductive particles and the parylene binder form a sealing structure having a thickness of about 0.1 millimeter to about 2 millimeters.

8. The method of claim 1, further comprising:
    disposing second electrically non-conductive particles on the sealing structure formed from the electrically non-conductive particles and the parylene binder;
    introducing a second reactive parylene monomer in a vapor form into second interstitial spaces among the second electrically non-conductive particles; and
    forming a second parylene binder in the second interstitial spaces of the second particles from the second reactive parylene monomer.

9. The method of claim 1, wherein the electronic component is a multi-chip module.

10. An encapsulated electronic assembly comprising:
    a rigid or a flexible substrate;
    one or more components disposed on the substrate;
    a sealing structure comprising a plurality of electrically non-conductive particles and a parylene binder locking the plurality of electrically non-conductive particles to each other, to the substrate, and to the one or more components disposed on the substrate, the electrically non-conductive particles comprising hexagonal boron nitride, silicon nitride, or a combination comprising at least one of the foregoing;
    a heat sink disposed on the sealing structure opposing the substrate; and
    a package base,
    wherein the substrate is disposed on the package base and the heat sink is coupled to the package base.

11. The encapsulated electronic assembly of claim 10, wherein the electrically non-conductive particles form a continuous network.

12. The encapsulated electronic assembly of claim 10, wherein
the parylene binder comprises a poly-para-xylylene; and
the volume ratio of the electrically non-conductive particles relative to the parylene binder is about 70:30 to about 99.99:0.01.

13. The encapsulated electronic assembly of claim 10, wherein the one or more components comprise wire bonds, chips, surface mount devices (SMD), sensing devices, conductive and isolation structured created by additive manufacturing, or a combination comprising at least one of the foregoing.

14. The encapsulated electronic assembly of claim 10, wherein the encapsulated electronic assembly is a multi-chip module.

15. A downhole tool comprising the encapsulated electronic assembly of claim 10.

16. The encapsulated electronic assembly of claim 10, wherein the electrically non-conductive particles comprise hexagonal boron nitride or a combination of hexagonal boron nitride and silicon nitride.

17. The encapsulated electronic assembly of claim 10, wherein the electronically non-conductive particles have an irregular shape.

18. The encapsulated electronic assembly of claim 10, wherein the electronically non-conductive particles have an average diameter of about 0.5 micron to about 15 microns.

19. The downhole tool of claim 15, wherein the sealing structure is coupled to a curved surface opposing the substrate.

20. The downhole tool of claim 19, wherein the curved surface has extrusions.

21. The downhole tool of claim 19, wherein the cured surface is an inner wall of the downhole tool.

22. The downhole tool of claim 20, wherein the substrate of the encapsulated electronic assembly is disposed on a segment of the downhole tool or a cavity in the downhole tool.

23. The downhole tool of claim 20, wherein the sealing structure that comprises the electrically non-conductive particles and the parylene binder is extended to the segment of the downhole tool or the cavity in the downhole tool locking the encapsulated electronic assembly to the segment or cavity of the downhole tool.

* * * * *